(12) United States Patent
Choi

(10) Patent No.: US 7,687,324 B2
(45) Date of Patent: Mar. 30, 2010

(54) SEMICONDUCTOR DEVICE AND METHOD OF FABRICATING THE SAME

(75) Inventor: Jae Young Choi, Busan (KR)

(73) Assignee: Dongbu Hitek Co., Ltd., Seoul (KR)

( * ) Notice: Subject to any disclaimer, the term of this patent is extended or adjusted under 35 U.S.C. 154(b) by 117 days.

(21) Appl. No.: 11/852,178

(22) Filed: Sep. 7, 2007

(65) Prior Publication Data

US 2008/0157387 A1    Jul. 3, 2008

(30) Foreign Application Priority Data

Dec. 29, 2006   (KR)   .................. 10-2006-0137360

(51) Int. Cl.
*H01L 29/72* (2006.01)

(52) U.S. Cl. .................. 438/142; 438/197; 438/201; 438/221; 438/634; 438/637

(58) Field of Classification Search ............... 438/142, 438/197, 201, 221, 634, 637
See application file for complete search history.

(56) References Cited

U.S. PATENT DOCUMENTS

2009/0011594 A1 *  1/2009  Hsu et al. ............... 438/674

FOREIGN PATENT DOCUMENTS

JP       2000-036546       2/2000

* cited by examiner

*Primary Examiner*—Edward Wojciechowicz
(74) *Attorney, Agent, or Firm*—Workman Nydegger

(57) ABSTRACT

The present invention relates to a semiconductor device, comprising a plurality of word lines arranged on a semiconductor substrate, wherein plurality of word lines are grouped into groups of two word lines, a spacer dielectric layer formed between each group of two word lines, and an interlayer dielectric layer formed so as to fill the area between the word lines in each group of two word lines and cover the word lines and the spacer dielectric layers.

7 Claims, 4 Drawing Sheets

SEMICONDUCTOR DEVICE AND METHOD OF FABRICATING THE SAME

BACKGROUND OF THE INVENTION

This application claims the benefit of Korean Patent Application No. 10-2006-0137360, filed on Dec. 29, 2006, which is hereby incorporated by reference as if fully set forth herein.

1. Field of the Invention

The present invention relates to a semiconductor device and a method of fabricating the same. More specifically, the present invention relates to a semiconductor device and a method of fabricating a semiconductor device with gap-filling and an interlayer dielectric layer between word lines.

2. Discussion of the Related Art

As the high integration of a semiconductor device is progressed, the spaces between patterns have become narrower, meaning that the process of filling an interlayer dielectric layer for the interlayer insulation between metal-wirings in the spaces has become increasingly difficult.

In particular, the cell arrays of semiconductor devices are formed with a minimum line width and pitch, meaning that the gap between the word lines is often too narrow to facilitate a sufficient filling of the gap formed at the both sides of the word line.

In flash memory devices, the vertical size of the word line is large enough that the gap between the word lines has a high aspect ratio compared to other devices. Further, since the width of the lower portion word line is larger than the upper portion of the word line, the gap between the word lines at the area close to the substrate is small, meaning that the interlayer dielectric layer may not completely fill the gap, creating a void in the gap.

FIG. 1 is a cross-sectional view of a semiconductor device of the current art. FIG. 1 describes a flash memory device as an example of a semiconductor device. The flash memory device includes a device isolating layer 12 formed on the semiconductor substrate 10 which defines active areas 18 and a plurality of word lines 14 arranged across the top of the active areas 18 of the device isolating layer 12. The gaps between adjacent word lines 14 alternate between relatively narrow gaps 26 and wide gaps 28. The area in the relatively narrow gap 26 forms a source area 22, while the portion in the relatively wide gap 28 forms a drain area 24 which may be connected to a bit line contact (not shown).

In order to connect the source areas 22 in a direction parallel with the word lines 14, a portion of the device isolating layer 12 between the word lines 14 below each narrow gap 26 is removed, and the sides of the word lines 14 are formed with spacer dielectric layers 16s and 16d. The spacer dielectric layer 16s is formed between alternating adjacent word lines 14 in order to fill the narrow gap 26, and the spacer dielectric layer 16d is formed between in the remaining word lines 14 in order to reduce the size of the wide gap 28.

Typically, an interlayer dielectric layer 20 is subsequently formed over the substrate 10, word lines 14, and the spacer dielectric layers 16s and 16d, so as to completely fill the gaps 26 and 28 between the word lines. Unfortunately, however, because of the small size and the shape of the resulting gap 20a between the word lines 14, which often has a wider base than top, it is often difficult to sufficiently fill the resulting gap 20a with the interlayer dielectric layer 20, leaving voids or bubbles in the resulting gap 20a near the substrate 10.

BRIEF SUMMARY OF THE INVENTION

The present invention proposes to solve the problems. It is an object of the present invention to provide a semiconductor device and a method of fabricating the same, wherein the interlayer dielectric layer is completely filled in the gap between word lines.

In order to accomplish the objects, there is provided a semiconductor device comprising: a plurality of word lines arranged into a plurality of pairs of word lines on a semiconductor substrate, a plurality of spacer dielectric layers formed in an area between the pairs of word lines, and an interlayer dielectric layer formed so as to cover the word lines and spacer dielectric layers and fill an area between the word lines in each pair of word lines.

In order to form the semiconductor device described above, another aspect of the invention is a method of fabricating a semiconductor device comprising forming a plurality of word lines on a semiconductor substrate which are arranged into a plurality of pairs of word lines, forming a spacer mask film that covers a spacer dielectric layer formed between each pair of word lines which exposes the spacer dielectric layer formed in the space between the word lines in each pair of word lines, removing the exposed spacer dielectric layer formed between the word lines in each pair of word lines using the spacer mask film as an etching barrier, and forming an interlayer dielectric layer over the spacer dielectic layer formed between each pair of word lines and the word lines which also fills the space between the word lines in each pair of word lines.

BRIEF DESCRIPTION OF THE DRAWINGS

The accompanying drawings, which are included to provide a further understanding of the invention and are incorporated in and constitute a part of this application. The drawings illustrate embodiment(s) of the invention and together with the description serve to explain the principle of the invention. In the drawings.

DETAILED DESCRIPTION OF THE INVENTION

Hereinafter, a preferred embodiment of a semiconductor device and a method of fabricating the same will be described with reference to the accompanying drawings.

The other objects, features, and advantages of the present invention will be apparent from the detailed description of the embodiments in conjunction with the accompanying drawings.

Hereinafter, the constitution and effect of the embodiments of the present invention will be described with reference to the accompanying drawings in order to describe at least one embodiment that may be performed in accordance with the invention. However, the technical idea, core constitution, and effect of the present invention are not limited thereto.

Figure 2:
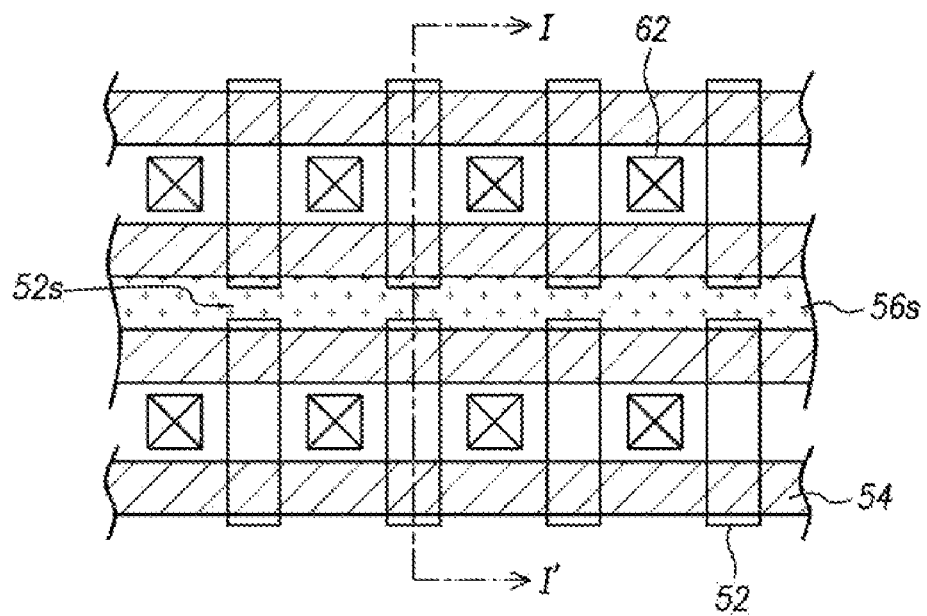
FIG. 2 is a plan view of a semiconductor device according to an example of the present invention.
Figure 3:
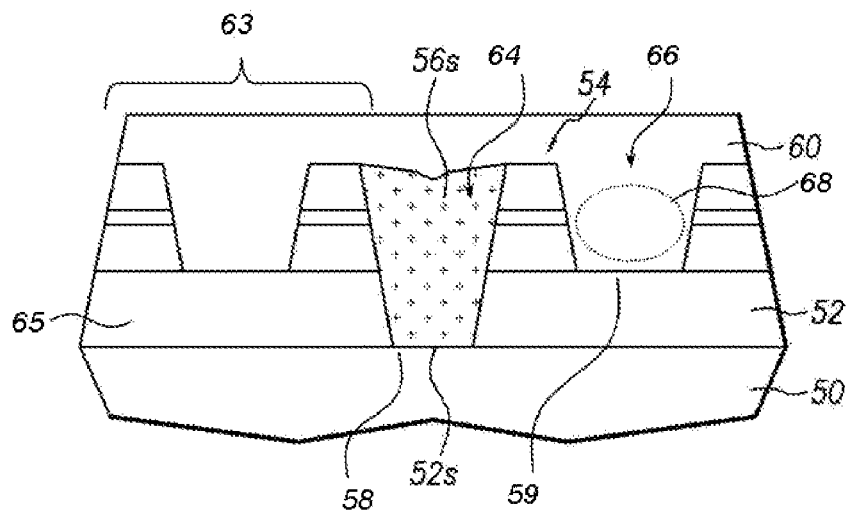
FIG. 3 is a cross-sectional view taken along lines I-I of FIG. 2.

FIG. 2 is a plan view of a semiconductor device according to an embodiment of the present invention, and FIG. 3 is a cross-sectional view taken along lines I-I' of FIG. 2.

Referring to FIGS. 2 and 3, a device isolating layer 52 is formed on a semiconductor substrate 50 which defines a plurality of active areas 65, and a plurality of word lines 54 are arranged across the upper surface of the active areas 55 of the device isolating layer 52. The word lines 54 are grouped into pairs of word lines 63 so that a narrow gap 58 is formed between each pair of word lines 63 and a wide gap 59 is formed between each word line 54 in each pair of word lines 62.

Figure 1:
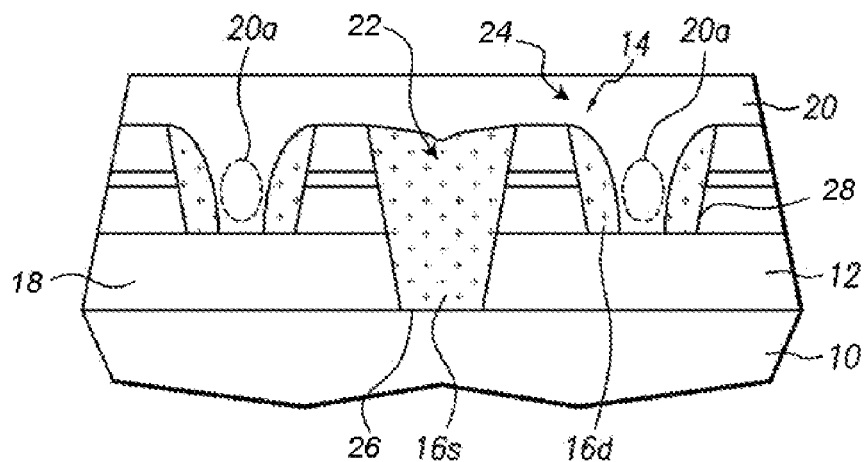
FIG. 1 is a cross-sectional view of a semiconductor device according to the related art.

In order to facilitate the detailed description of the present invention, the respective word lines will be described with reference to a source area 64 and drain area 66. The source area 64 relates to the area of the narrow gap 58 formed between each pair of word lines 63 and the drain area 66 relates to the area of the wide gap 59 formed between each word line 54 in a pair of word lines 63. Similarly, the gap area formed in the drain area 66 which corresponds to the remaining gap area 20a of FIG. 1 is referred to as the remaining gap area 68.

Within the source area 64, a portion of the device isolating layer 52 is removed so that the surface of the semiconductor substrate 50s is exposed in a direction that is parallel with the word lines 54, in order to create a common source line. In comparison, the drain area 66 is used to connect bit line contacts 62 to the active areas 65.

In the present invention, a spacer dielectric layer 56s is formed in the source area 64 between each pair of word lines 62. Unlike the semiconductors of the present art, however, no spacer dielectric layer is formed in the drain area 66 where the gap area has a low aspect ratio. Instead, an interlayer dielectric layer 60 is formed over the word lines 54, spacer dielectric layer 56s, and in the gap between the word lines 54 in a pair of word lines 63.

Thus one advantage of the present invention is that the spacer dielectric layer 56s is formed in the narrow gaps 58 between each pair of word lines 63 where the source area 64 is formed. Because of the size and shape of the source area 64, the narrow gap 58 may be filled with the spacer dielectric layer 56s without the risk of forming any voids or bubbles. Moreover, because the area is filled with the spacer dielectric layer 56s, the narrow gap 58 may not be filled with the interlayer dielectric layer 60.

As previously mentioned with reference to FIG. 1, the drain area in the semiconductor of the current art, as shown in FIG. 1 includes the spacer dielectric layer 16d, which increases the aspect ratio of the remaining gap area 20a. This increased aspect ratio makes it difficult to sufficiently fill the drain area 24 without leaving gaps or voids of dielectric material in the gap area 20a. However, in the present invention shown in FIG. 3, the spacer dielectric layer is removed from the drain area 66 so that the aspect ratio is lower than the related art. Advantageously, this makes it easier to suppress the generation of voids or gaps when the interlayer dielectric layer 60 is filled with in the gap area 68.

FIGS. 4 to 7 are various illustrations explaining a method for manufacturing a semiconductor device illustrated in FIG. 3, according to another aspect of the present invention.

Figure 4:
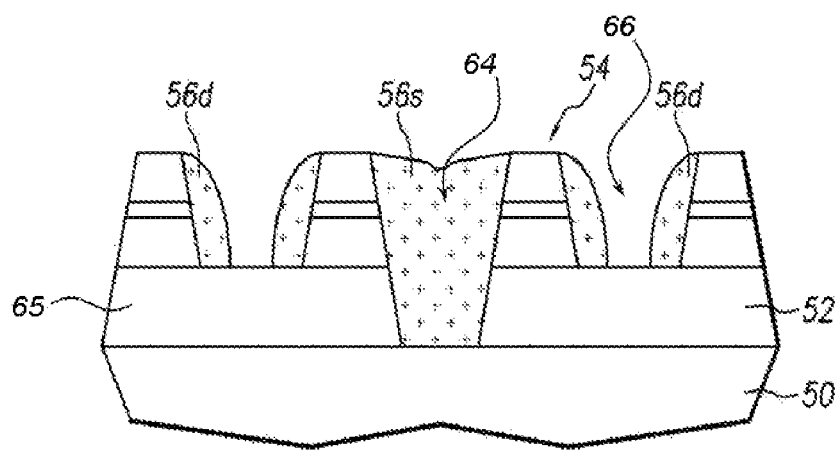
FIGS. 4 and 6 are cross-sectional views for explaining a method of fabricating a semiconductor device according to an example of the present invention.

As shown in FIG. 4, a device isolating layer 52 is formed on a semiconductor substrate 50 in order to define an active area 65, with a plurality of parallel word lines 54 being formed across the upper surface of the active areas 65 of the device isolating layer 52. The word lines 54 can have a profile wherein the width of the lower portion of each word line 54 is larger than the width of the upper portion. For example, in a preferred embodiment of the invention, when forming a word line with a 90 nm width, the distance between the bottom portion of two adjacent word lines 54 is about 93 nm, while the distance between the top portion of two adjacent word lines is about 121 nm.

In a flash memory device, the word line 54 has a narrow gap 58 where the common source area 64 is formed and a wide gap 59 in the area where the drain area 66 is formed on an active area 65 of the device isolating layer 52. In order to connect the source areas 64 in a direction which is parallel to direction of the word lines 54, a self-aligning source process is performed wherein a portion of the device isolating layer 52 in the source area 64 is removed to expose the surface of the substrate 50s.

Figure 5:
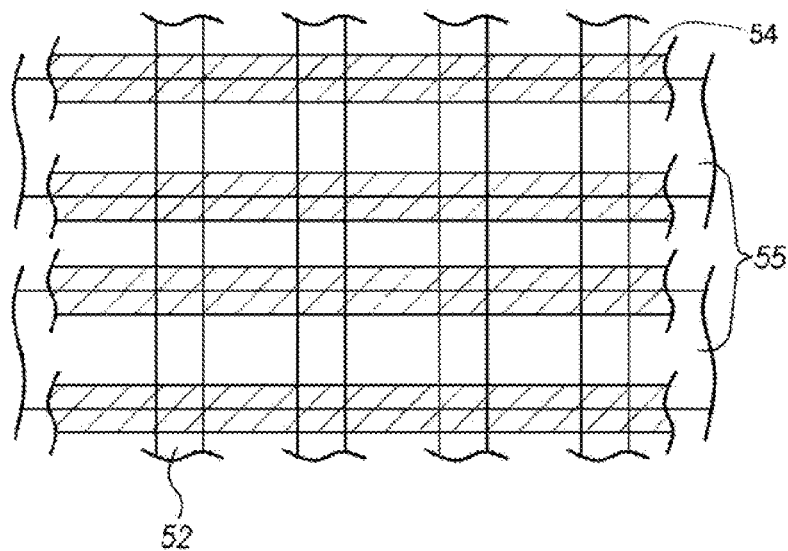
FIGS. 5 and 7 are plan views of a method of fabricating a semiconductor device according to an example of the present invention.

In order to perform this process of removing a aportion of the device isolating layer 52, a source mask film 55 is used which masks the drain area 66, so that the device isolating layer 52 below the word lines 54 in each pair of word lines 54 is not removed. FIG. 5 is a plan view showing the layout of a source mask film 55 in order to remove the device isolating layer 52 in the source areas 64 in order to form a common source area between each pair of word lines 54.

As shown in FIG. 5, the source mask film 55 used during the self-aligning source process to group two word lines 54 into a plurality of pairs of word lines 63 and simultaneously cover the pairs of word lines 63 and the drain areas 66 during the process. In other words, the source mask film 55 is formed across the top of the word lines 54 in order to shield a plurality of pairs of word lines 63 and drain areas 66 while exposing the semiconductor substrate 50 in the area between the plurality of word line pairs 63 in order to create a plurality of interconnected source areas 64.

Once the device isolating layer 52 between the word lines 54 is removed using the source mask film 55 as an etching barrier to expose the surface of the substrate 52s, the source mask film 55 is removed. Next, as shown in FIG. 5, the spacer dielectric layer is added and the spacer dielectric layers 56s and 56d are formed on both sides of the word lines 54. In the source area 64, the spacer dielectric layers 56s is formed along the side walls of the word liens 54 and connected so as to fill the narrow gap 58 between the neighboring word lines 54. In contrast, in the drain area, the spacer dielectric layer 56s which is formed along the side walls of the word lines 54 reduces the width of the gap area between the neighboring word lines 54, without entirely filling the area of wide gap 59, leaving a gap area with an relatively high aspect ratio.

Figure 6:
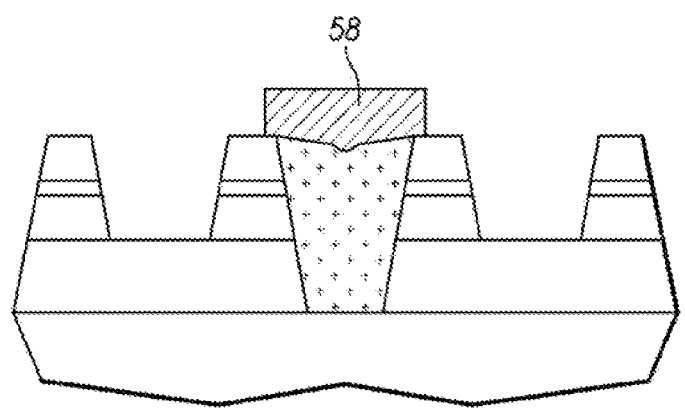
Figure 7:
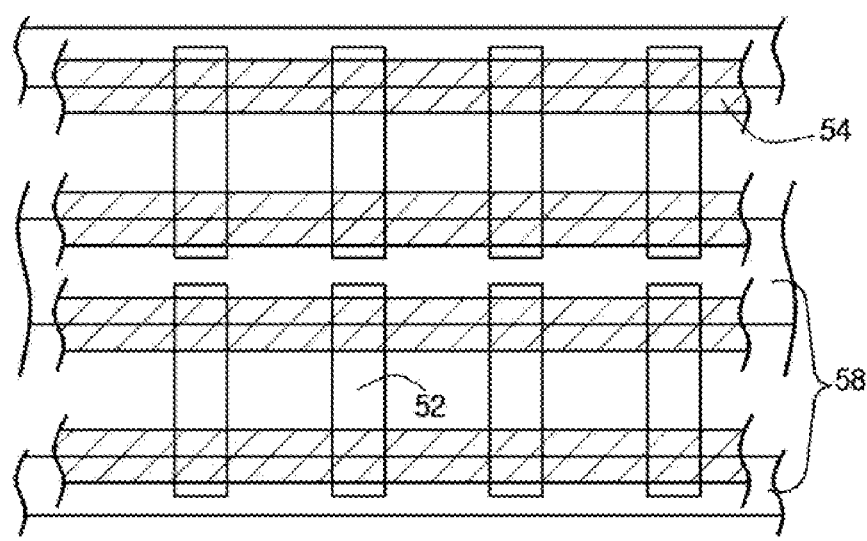

FIG. 6 is a cross-sectional view of a semiconductor device during the next portion of the formation process of one embodiment of the invention, and FIG. 7 is a plan view showing a spacer mask film 58 which is used to removing the spacer dielectric layer 56d formed during the process described above.

After the spacer dielectric layers 56s and 56d have been formed, a spacer mask film 58 is placed on the top of the word lines 58 adjacent to the source area 64, as shown in FIG. 6, so as to cover the spacer dielectric layer 56s. As shown in FIG. 7, the spacer mask film 58 arranged parallel to the word liens 58, with a portion overlapping with the word lines 58. In one embodiment, the spacer mask film 58 is a reverse pattern of the source mask film 55. In other words, the spacer mask film 58 exposes the portion covered by the source mask film 55, and covers the portion exposed by the source mask film 55. Therefore, in one embodiment, the spacer mask film 58 and the source mask film 55 use the same reticle, during a negative photoresist and positive photoresist process, respectively, making it possible to performing the process using a single reticle.

For example, in one embodiment the spacer mask film 58 is a negative photoresist film, which is exposed using the same reticle used in forming the source mask film 55, which is a positive photoresist film. The negative photoresist film comprises only the exposed portion by developing the film and the removing the non-exposed portion. During the creation of the source mask film 55, the non-exposed portion of the negative photoresist film becomes the exposed portion of the source mask film 55.

Using this process, the space dielectric layer 56*d* in wide gap 59 portion of the of the semiconductor is removed using the spacer mask film 58 as an etching mask. In a subsequent process, the spacer mask film 58 is removed and the interlayer dielectric layer is formed over the substrate to fill the narrow gap 58 between the word lines 54 in each pair of word lines 63.

Advantageously, by removing the spacer dielectric layer 56*d* formed in the drain area 66 between adjacent word lines 54, the aspect ratio of the wide gap 59 is increased, making it easier to completely fill the gap area 59 with the interlayer dielectric layer 60. Thus, the aspect ratio of the wide gap 59 is lowered so that the interlayer dielectric layer 60 is able to completely fill the gap 59 without generating any spaces or voids, making it possible to prevent the degradation of various characteristics of the device.

Although the preferred embodiment of the present invention is described, it will be apparent to those skilled in the art that various modifications and variations can be made in the present invention without departing from the spirit or scope of the invention. Thus, it is intended that the present invention cover the modifications and variations of this invention that come within the scope of the appended claims and their equivalents.

As described above, with the present invention, the removal of the spacer dielectric layer in the drain area increases the aspect ratio of gap in the drain area, allowing the gap area to be completely filled with the interlayer dielectric layer in order to prevent any spaces or voids in the drain area of the semiconductor.

What is claimed is:

1. A method of fabricating a semiconductor device comprising:
    forming a plurality of word lines on a semiconductor substrate, wherein in the plurality of word lines are grouped into a plurality of groups of two word lines;
    forming a plurality of spacer dielectric layers between the groups of two word lines and between the word lines within each group of two word lines;
    forming a spacer mask film that covers the spacer dielectric layer formed between the groups of two word lines;
    removing the spacer dielectric layer formed between the word lines within each group of two word lines using the spacer mask film as an etching barrier to form a space between the word lines within each group of two word lines; and
    forming an interlayer dielectric layer between the space between the word lines within the groups of two word lines and over the spacer dielectric layer and word lines.

2. The method according to claim 1, the spacer mask film is formed in a configuration parallel to the word lines.

3. The method according to claim 1, further comprising the steps of:
    defining an active area by forming a device isolating layer on the semiconductor substrate;
    forming a source mask film which is parallel to the word lines, which covers each group of two word lines; and
    removing a portion of the device isolating layer which is between each group of two word lines;
    wherein the spacer mask film is a reverse pattern of the source mask film.

4. The method according to claim 3, wherein forming the spacer mask film comprises:
    forming a photoresist film with different polarity than a photoresist to form the source mask film on the semiconductor substrate;
    exposing the photoresist film using a reticle in order to form the source mask film; and
    forming the spacer mask film on the area covered by the source mask film by developing the photoresist film.

5. A method of fabricating a semiconductor device comprising:
    forming a plurality of word lines on a semiconductor substrate, wherein in the plurality of word lines are grouped into a plurality of groups of two word lines;
    forming a device isolating layer on the semiconductor substrate;
    defining an active layer by removing a portion of the device isolating layer in areas between adjacent groups of two word lines;
    forming a plurality of spacer dielectric layers in the areas between the adjacent groups of two word lines;
    forming a spacer mask film that covers the spacer dielectric layer formed between the groups of two word lines;
    removing any residual spacer dielectric layer deposited on areas between the word lines within the groups of two word lines from forming the spacer dielectric layers in the areas between the groups of two word lines using the spacer mask film as an etching barrier; and
    forming a interlayer dielectric layer in the areas between word lines within the groups of two word lines and over the spacer dielectric layers and the word lines.

6. The method of claim 5, wherein defining an active area comprises:
    forming a source mask film which is parallel to the word lines, which covers each group of two word lines; and
    removing a portion of the device isolating layer which is in the areas between each group of two word lines;
    wherein the spacer mask film is a reverse pattern of the source mask film.

7. The method according to claim 6, wherein forming the spacer mask film comprises:
    forming a photoresist film with different polarity than a photoresist used to form the source mask film on the semiconductor substrate;
    exposing the photoresist film using a reticle in order to form the source mask film; and
    forming the spacer mask film on the area covered by the source mask film by developing the photoresist film.

* * * * *